US008455887B2

(12) United States Patent
Shirakawa et al.

(10) Patent No.: US 8,455,887 B2
(45) Date of Patent: Jun. 4, 2013

(54) LED ILLUMINATION DEVICE FOR REDUCING OCCURRENCE OF COLOR HETEROGENEITY

(75) Inventors: Tomoki Shirakawa, Hirakata (JP); Yoko Matsubayashi, Sakai (JP)

(73) Assignee: Panasonic Corporation, Osaka (JP)

( * ) Notice: Subject to any disclaimer, the term of this patent is extended or adjusted under 35 U.S.C. 154(b) by 174 days.

(21) Appl. No.: 12/659,915

(22) Filed: Mar. 25, 2010

(65) Prior Publication Data

US 2010/0244061 A1  Sep. 30, 2010

(30) Foreign Application Priority Data

Mar. 26, 2009  (JP) ................. 2009-076147

(51) Int. Cl.
*H01L 29/18* (2006.01)
*H01L 33/00* (2010.01)

(52) U.S. Cl.
USPC .............. 257/88; 257/100; 438/26; 362/231; 362/249.06

(58) Field of Classification Search
None
See application file for complete search history.

(56) References Cited

U.S. PATENT DOCUMENTS

| 6,200,002 | B1 * | 3/2001 | Marshall et al. | 362/231 |
| 6,357,893 | B1 | 3/2002 | Belliveau | |
| 6,547,416 | B2 * | 4/2003 | Pashley et al. | 362/231 |
| 7,278,756 | B2 * | 10/2007 | Leu et al. | 362/260 |
| 7,439,549 | B2 * | 10/2008 | Marchl et al. | 257/88 |
| 7,646,034 | B2 * | 1/2010 | Ho et al. | 257/98 |
| 7,731,389 | B2 * | 6/2010 | Draganov et al. | 362/231 |
| 7,791,276 | B2 * | 9/2010 | Chou et al. | 313/512 |
| 2003/0053310 | A1 * | 3/2003 | Sommers | 362/231 |
| 2003/0178627 | A1 | 9/2003 | Marchl et al. | |
| 2004/0108818 | A1 | 6/2004 | Cok et al. | |
| 2006/0220046 | A1 * | 10/2006 | Yu et al. | 257/98 |
| 2007/0268694 | A1 * | 11/2007 | Bailey et al. | 362/231 |
| 2008/0308825 | A1 * | 12/2008 | Chakraborty et al. | 257/98 |
| 2009/0050911 | A1 * | 2/2009 | Chakraborty | 257/89 |
| 2009/0052178 | A1 | 2/2009 | Marchl et al. | |
| 2011/0001151 | A1 * | 1/2011 | Le Toquin | 257/98 |

FOREIGN PATENT DOCUMENTS

| DE | 10 2005 055 997 | 11/2006 |
| WO | 02/33756 | 4/2002 |
| WO | 02/50472 | 6/2002 |
| WO | 2008/052333 | 5/2008 |

OTHER PUBLICATIONS

The extended European Search Report dated Jul. 26, 2010.

* cited by examiner

*Primary Examiner* — Evan Pert
*Assistant Examiner* — Andres Munoz
(74) *Attorney, Agent, or Firm* — Bacon & Thomas PLLC

(57) ABSTRACT

An LED illumination device includes: a substrate; one or more red LED chips arranged on the substrate; a plurality of blue LED chips arranged on the substrate; and a plurality of third-color LED chips arranged on the substrate. Respective centers of the red LED chips are arranged on a circumference of a first circle having as its center a point on the substrate, respective centers of the blue LED chips being arranged on the circumference of a second circle concentric with and greater than the first circle, respective centers of the third-color LED chips being arranged in a region between the first circle and the second circle.

2 Claims, 16 Drawing Sheets

D=0

D=0

LED ILLUMINATION DEVICE FOR REDUCING OCCURRENCE OF COLOR HETEROGENEITY

FIELD OF THE INVENTION

The present invention relates to an LED illumination device capable of obtaining different illumination colors by additive color mixture, wherein monochromic LED chips of red, green and blue colors are used in combination.

BACKGROUND OF THE INVENTION

Conventionally, there is known an LED illumination device in which the light emission centers of monochromic LED chips of three primary colors are aligned to obtain, e.g., white irradiation light. In this LED illumination device, a single red LED chip is placed at the center of a substrate, while a plurality of green LED chips and a plurality of blue LED chips are arranged so that the LED chips of the same blue or green color are symmetrical with respect to the center of the substrate (see, e.g., JP Utility Model 6-79165A).

In this LED illumination device, the red LED chip is arranged at the center of the substrate by taking into account a fact that the LED chips of different colors are used as light emission dots of a display device, which serves primarily as a planar light source, and by paying attention to the color mixing performance at the central portion of a light emission surface. Such arrangement of the red LED chip helps prevent occurrence of chromaticity variations in the red color which is most sensitive to the eyes of a man and assists in reducing color heterogeneity in the high luminance region of a light emission surface.

However, in case where an LED lamp of the afore-mentioned LED illumination device is used as a spotlight for irradiating a wall surface or the like, a hue of two colors, i.e., a green color and a blue color, is generated in the low luminance region of a peripheral portion of an irradiation pattern. Therefore, chromaticity variations are likely to occur.

SUMMARY OF THE INVENTION

In view of the above, the present invention provides an LED illumination device in which color heterogeneity is hard to occur in the periphery of an irradiation pattern when different illumination colors are obtained by additive color mixture.

In accordance with an aspect of the present invention, there is provided an LED illumination device including: a substrate; one or more red LED chips arranged on the substrate; a plurality of blue LED chips arranged on the substrate; and a plurality of third-color LED chips arranged on the substrate, wherein respective centers of the red LED chips are arranged on a circumference of a first circle having as its center a point on the substrate, respective centers of the blue LED chips being arranged on the circumference of a second circle concentric with and greater than the first circle, respective centers of the third-color LED chips being arranged in a region between the first circle and the second circle.

In accordance with the aspect of the present invention, only the hue whose luminance difference and chromaticity difference are most difficult to perceive is distributed near the periphery of the irradiation light. This makes it possible to reduce possibility of occurrence of color heterogeneity in the periphery of an irradiation pattern.

Preferably, the LED illumination device further includes bell-shaped sealing portions for independently covering the red, blue and third-color LED chips, wherein curvatures of the sealing portions near the intersecting points between surfaces of the sealing portions and optical axes of the red, blue and third-color LED chips are set so that the sealing portions covering the blue LED chips have a smaller curvature than that of the sealing portions covering the red LED chips.

In accordance with the above, the light emitted from the blue LED chips is diffused more easily than the light emitted from the red LED chips. Thus, an increased amount of blue light is distributed in the peripheral region of the irradiation light. This makes it possible to reduce the likelihood of occurrence of color heterogeneity, without having the blue LED chips spaced apart from the center of the substrate with an unnecessarily long distance.

The LED illumination device may further include a bell-shaped sealing portion for covering all the red, blue and third-color LED chips, the sealing portion including a light diffusion agent, concentration of the light diffusion agent being greater in a peripheral region of the first circle than in a region near the center of the first circle.

In accordance with the above, the blue irradiation light is diffused toward the peripheral region. This makes it possible to reduce the likelihood of occurrence of color heterogeneity. In addition, all the LED chips are covered by the single sealing portion. Therefore, there is no need to form different sealing portions in the respective LED chips. This makes it possible to reduce the number of production steps and the production cost.

Preferably, the LED illumination device further includes a light diffusion member arranged at a light irradiation side of the red, blue and third-color LED chips, the light diffusion member having greater diffuseness in a peripheral region of the first circle than in a region near the center of the first circle.

In accordance with the above, the light emitted from the blue LED chips is diffused toward the peripheral region by the diffusion member. This makes it easy to reduce the likelihood of occurrence of color heterogeneity.

The LED illumination device may further include a reflection plate arranged at a light emission side of the red, blue and third-color LED chips, the reflection plate having a bell-shaped inner surface, curvature of the surface of the reflection plate at the intersecting points between the reflection plate and light emission surfaces of the red, blue and third-color LED chips being set so that the curvature of the surface of reflection plate around the blue LED chips becomes smaller than that around the red LED chips.

In accordance with the above, the light irradiated from the blue LED chips is well-diffused toward the peripheral region. This makes it possible to prevent occurrence of color heterogeneity. In addition, the diffusion of the light emitted from the respective LED chips is performed by the bell-shaped reflection plates. This reduces the light transmission loss as compared with the case where the sealing portion is used.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to accompanying drawings which form a part hereof.

An LED illumination device in accordance with a first embodiment of the present invention will now be described with reference to FIGS. 1 to 3B.

Figure 1:
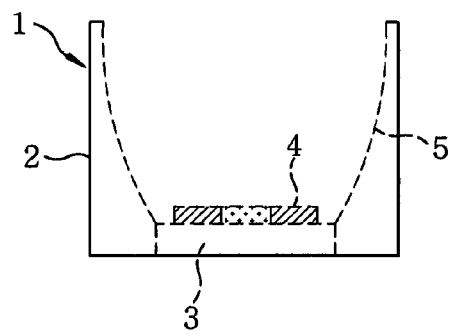
FIG. 1 is a side view showing an LED illumination device in accordance with a first embodiment of the present invention.
Figure 2:
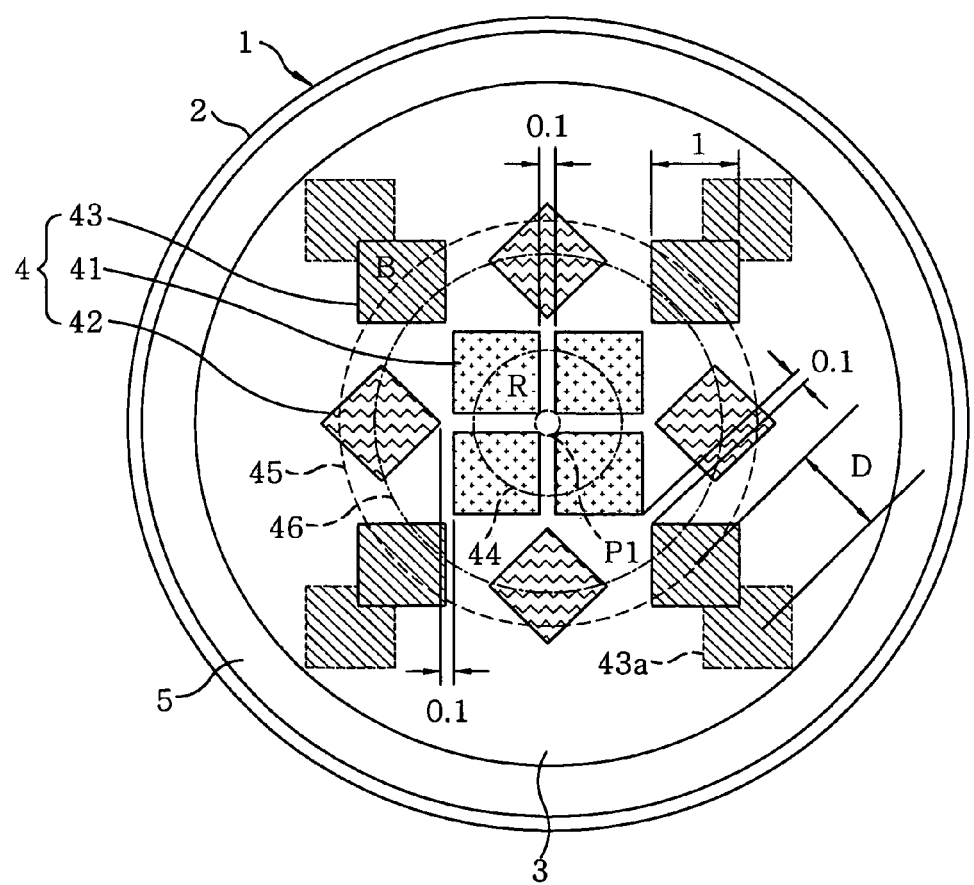
FIG. 2 is a plane view of the LED illumination device shown in FIG. 1.

Referring to FIGS. 1 and 2, the LED illumination device 1 in accordance the present embodiment includes a generally cylindrical body 2 made of a resin or a metallic material and a substrate 3 provided on the bottom of the body 2 and formed of a printed board or the like. The LED illumination device 1 further includes a plurality of LED chips 4 arranged on the substrate 3, and a reflection plate 5 provided inside the body 2 and configured to reflect the light emitted from the LED chips 4 to the outside.

The LED illumination device 1 in accordance with the present embodiment has been conceived by paying attention to the color of the peripheral portion of an irradiation pattern as well as the color of the central portion thereof. The LED illumination device 1 ensures that only one hue appears in the peripheral portion of the irradiation pattern not to bring about a color contrast effect in the peripheral portion. In addition, the color heterogeneity in the irradiation pattern is reduced by using a blue hue as the afore-mentioned hue. It has been confirmed by a subjective evaluation test that the difference in luminance and chromaticity of the blue hue is most difficult to determine.

The LED chips 4 including four red LED chips 41, four green LED chips 42 and four blue LED chips 43 are mounted on the substrate 3. Each of the LED chips 4 has a square shape of 1×1 mm in size. The red, green and blue LED chips 41, 42 and 43 are respectively provided with positive electrodes connected to power-supplying lead terminals via conductive patterns (not shown) formed on the substrate 3 and negative electrodes connected to a common grounding terminal formed on the substrate 3. Thus, the red, green and blue LED chips 41, 42 and 43 can emit light when a driving current is applied between the lead terminals arbitrarily selected and the common terminal.

Centers of the red LED chips 41 are disposed on the circumference of a first circle 44 having as its center point P1 on the substrate 3. Centers of the blue LED chips 43 are disposed on the circumference of a second circle 45 concentric with the first circle 44 and greater than the first circle 44. Centers of the green LED chips 42 are disposed within a region between the first circle 44 and the second circle 45. In the present embodiment, the centers of the green LED chips 42 are disposed on the circumference of a third circle 46 concentric with the first circle 44 and greater than the first circle 44 but smaller than the second circle 45. However, the present invention is not limited thereto. Further, the LED chips 4 are all arranged in such a way as not to overlap with each other.

The red, green and blue LED chips 41, 42 and 43 are arranged on the circumferences of the first, second and third circles 44, 46 and 45 in a symmetrical relationship with respect to the center point P1 of the substrate 3 and at a same interval. It is not always necessary that the red, green and blue LED chips 41, 42 and 43 are arranged at the same interval on the respective circumferences.

More specifically, the red LED chips 41 are arranged around the center point P1 at an interval of 0.1 mm and in a square shape. Each of the green LED chips 42 has one diagonal line extending along the radius of the third circle passing between the adjacent red LED chips 41 and is arranged in a 45°-rotated position with respect to each of the red LED chips 41. The shortest distance between the red LED chips 41 and the green LED chips 42 is set equal to 0.1 mm. The blue LED chips 43 are arranged on the circumference of the second circle 45 in a state that they are shifted along the diagonal lines of the red LED chips 41 joining the centers of the red LED chips 41 and the center point P1 of the substrate 3. The diagonal lines of the blue LED chips 43 and the red LED chips 41 lie on the same lines. The blue LED chips 43 may be shifted along the diagonal lines to the positions of the blue LED chips 43a indicated by dot-lines, at which time the shift distance is denoted by "D".

A gap between adjacent corners of the blue LED chips 43 and the red LED chips 41 on the diagonal lines thereof is set to 0.1 mm. Likewise, a gap between the mutually-parallel sides of the red LED chips 41 and the blue LED chips 43 is set to 0.1 mm. In the manner as set forth above, the red, green and blue LED chips 41, 42 and 43 have a size of 1×1 mm and are arranged with a minimum gap of 0.1 mm.

In the present embodiment, the reflection plate 5 is integrally formed with the body 2 and has increased light reflectance on its surface. The reflection plate 5 is so shaped as to change the course of the light emitted from the LED chips 4.

Figure 3A:
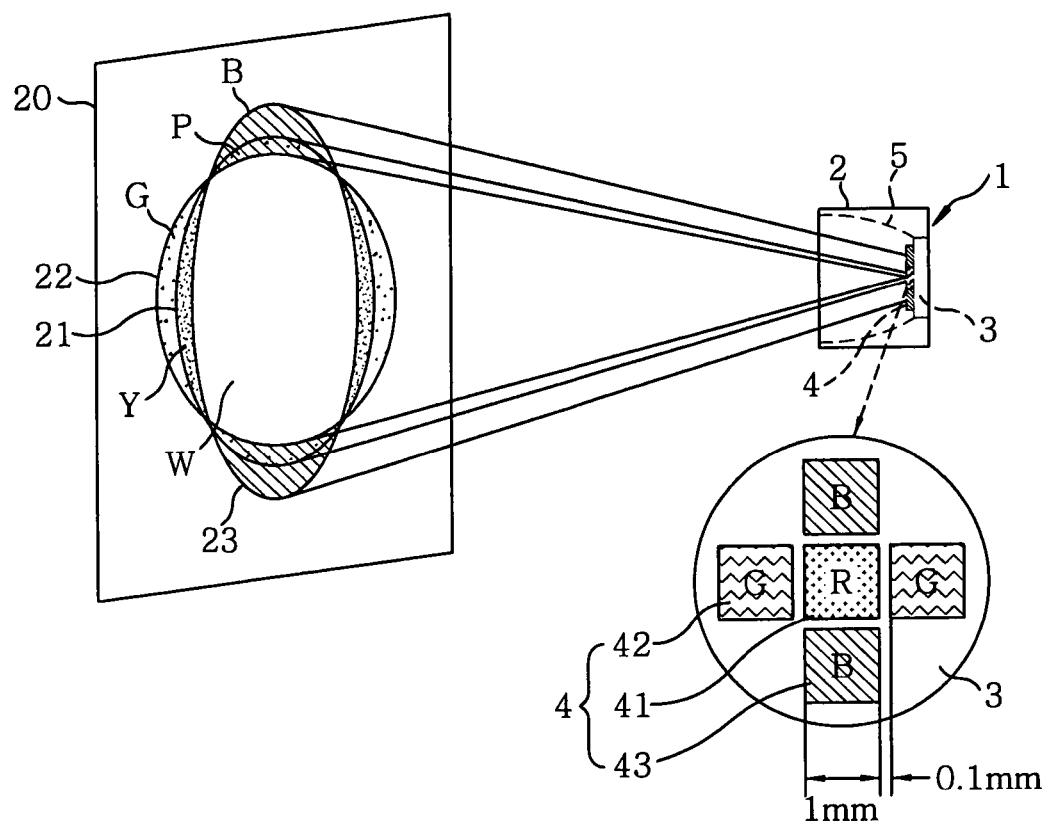
FIG. 3A shows an irradiation pattern available in a comparative conventional LED illumination device.

For the purpose of comparison, FIG. 3A shows an irradiation pattern available in an LED illumination device 1A having an LED arrangement which is different from that in accordance with the present embodiment. The LED illumination device 1A includes five LED chips 4 each having a size of 1×1 mm. The LED chips 4 include one red LED chip 41 provided at the center of a substrate 3, two green LED chips 42 arranged in a symmetrical relationship with respect to the red LED chip 41 and two blue LED chips 43 arranged in a symmetrical relationship with respect to the red LED chip 41. The green LED chips 42 and the blue LED chips 43 are arranged in a cross shape. A gap between the adjacent LED chips 4 is set to 0.1 mm.

In the irradiation pattern formed on an wall surface 20 when the LED illumination device 1A is used as a light source of spotlight, elliptical green and blue patterns are overlapped with a generally circular red pattern in a cross shape. Therefore, the central region of the irradiation pattern has a white color W because the red, green and blue patterns 21, 22 and 23 formed by the red, green and blue LED chips 41, 42 and 43 are overlapped with each other. The peripheral region outside the central region, in which the red and blue patterns 21 and 23 are overlapped with each other, has a mixed color of red and blue (i.e., a purple color P). The peripheral region outside the central region, in which the red and green patterns 21 and 22 are overlapped with each other, has a mixed color of red and green (i.e., a yellow color Y). The marginal regions outside the peripheral regions, which are defined by the green and blue patterns 22 and 23, have a green color G and a blue color B. For that reason, two hues of green and blue appear in the low-luminance marginal regions, and chromaticity variations are likely to occur in those regions.

Figure 3B:
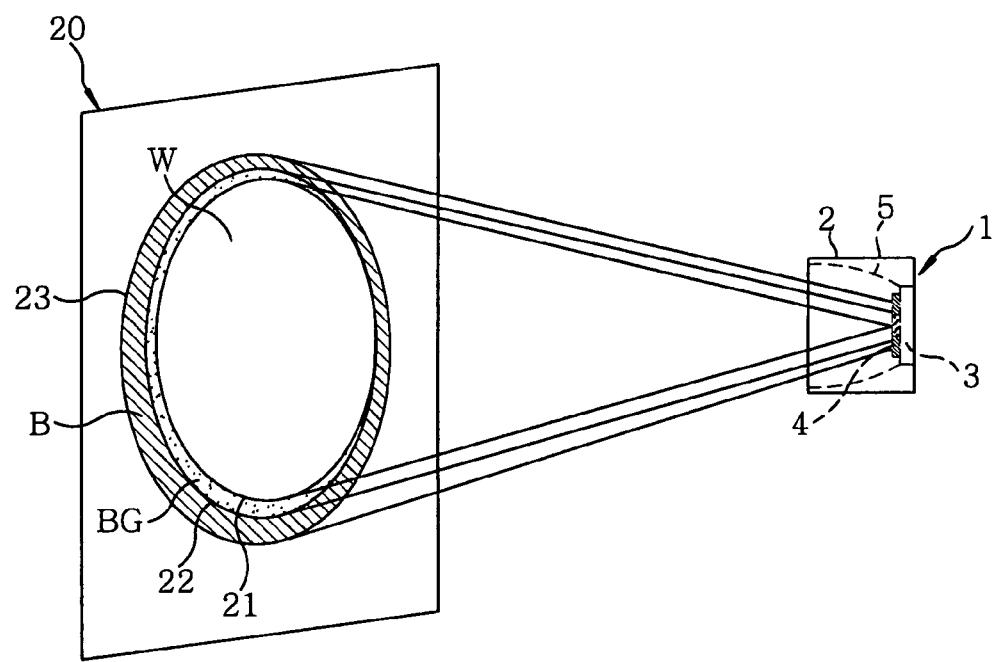
FIG. 3B illustrates an irradiation pattern available in the LED illumination device of the first embodiment.

FIG. 3B illustrates an irradiation pattern available when the LED illumination device 1 in accordance with the present embodiment is used as a light source of spotlight. This irradiation pattern has a light distribution determined by the arrangement of the LED chips 4 shown in FIG. 2. The red, green and blue patterns 21, 22 and 23 formed by the red, green and blue LED chips 41, 42 and 43 have a generally circular shape on the distal wall surface 20 because the red, green and blue LED chips 41, 42 and 43 are arranged in a square shape along the circumferences of the circles 44, 46 and 45. Therefore, the red, green and blue patterns 21, 22 and 23 make concentric circles and grow bigger in size in the named sequence. If the each number of the red, green and blue LED chips 41, 42 and 43 is increased, each of the red, green and blue patterns 21, 22 and 23 gets closer to a true circle.

As a result, the central region of the irradiation pattern has a white color W which is the mixture of red, green and blue. A region between the red pattern 21 and the green pattern 22 has a blue-green mixed color BG which is the mixture of green and blue. A region between the green pattern 22 and the blue pattern 23 has a blue color B. Only the blue color appears in the outermost periphery of the irradiation pattern, thereby reducing the likelihood of occurrence of chromaticity variations.

Figure 4A:
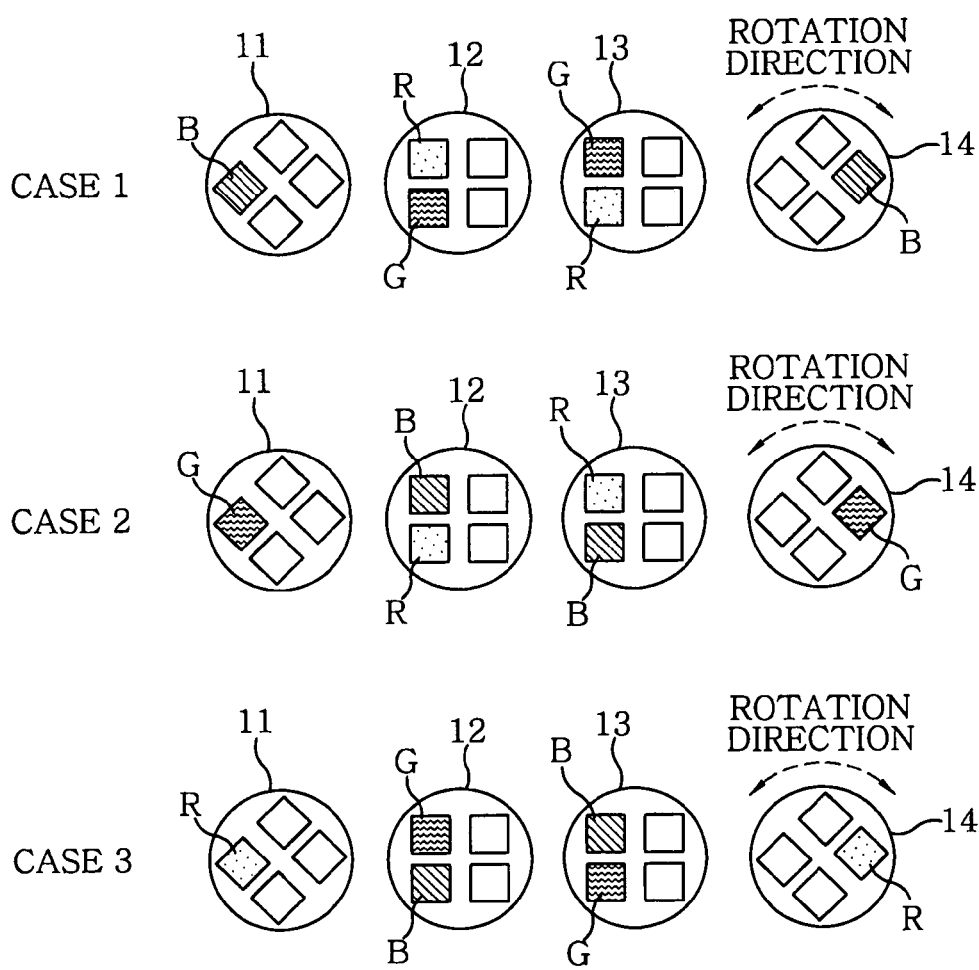
FIG. 4A is a side view showing an LED package for the generation of color heterogeneity used in a color heterogeneity evaluation test.

The present inventors have conducted subjective evaluation tests on the hues of the irradiation pattern formed by the irradiation light of the LED chips, which tests will be described with reference to FIGS. 4A, 4B and 4C. In these tests, four LED packages for generating color heterogeneity of red R, green G and blue B in the periphery of the irradiation pattern are used to clarify the influence of hues on the color heterogeneity. Three of the four LED packages (i.e., the LED packages 11, 12 and 13 in FIG. 4A) are used for base illumination and fixed to a stationary table 15, while the remaining one (i.e., the LED package 14 in FIG. 4A) is attached to a rotary disc 16. The intensity of monochromic light in the periphery of the irradiation pattern is adjusted by changing the rotation angle of the rotary disc 16. Referring to FIG. 4A, a monochromic blue color is irradiated on the periphery of the irradiation pattern in a case 1, a monochromic green color being irradiated in a case 2, a monochromic red color being irradiated in a case 3.

More specifically, the combinations of colors in the LED packages 11 to 14 are as follows. In the LED packages 11 and 14, a blue LED chip B is arranged in the outermost periphery of the irradiation pattern in the case 1, a green LED chip G in the case 2 and a red LED chip R in the case 3. In the LED packages 12 and 13, a red LED chip R and a green LED chip G are employed in the case 1, a blue LED chip B and a red LED chip R in the case 2, and a blue LED chip B and a green LED chip G in the case 3. The LED chips of one of the LED packages 12 and 13 are arranged in a vertically inverted relationship with the LED chips of the other.

Figure 4B:
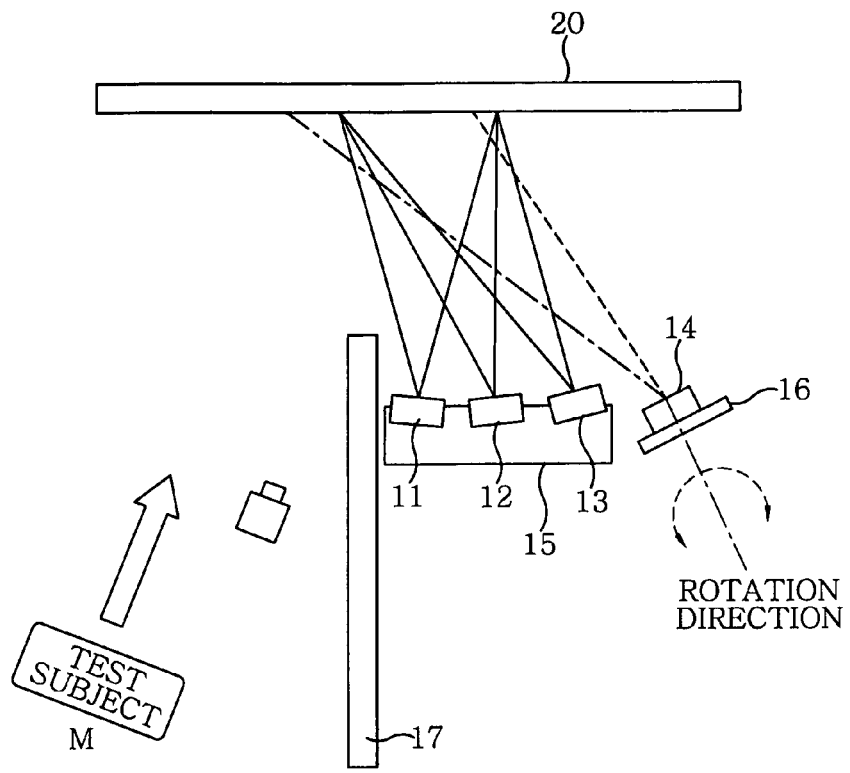
FIG. 4B shows an evaluation test environment.
Figure 4C:
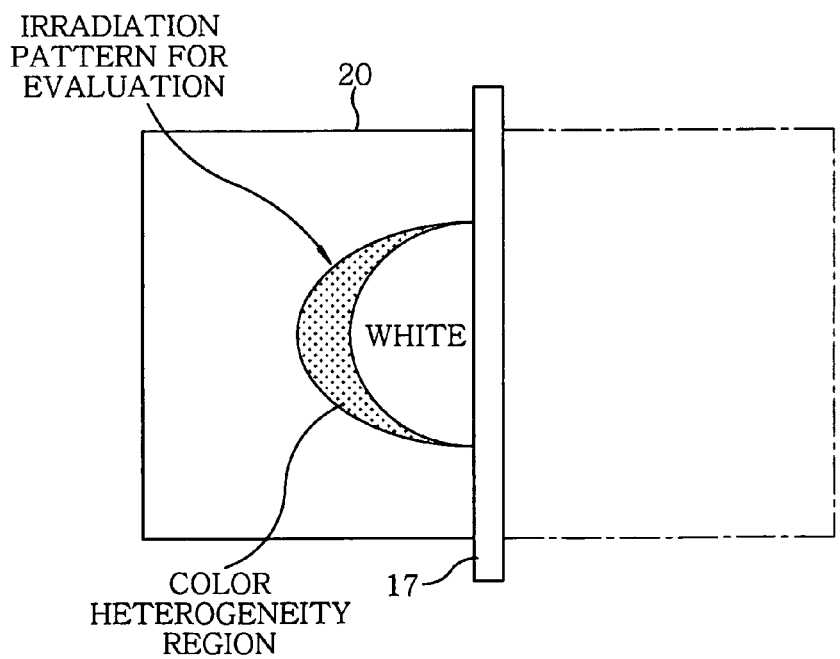
FIG. 4C illustrates an irradiation pattern for evaluation.

Referring to FIG. 4B, test subjects M (nine test subjects in this case) are positioned at the left side to evaluate the irradiation pattern formed on a wall surface screen 20 by the LED packages 11 through 14 positioned at the right side. A shading plate 17 is provided in the generally central portion of the screen 20 to ensure that the complementary color is not affected by the rotation of monochromic light. For adaptation purposes, a circular shading plate is provided in front of the test subjects so that they can adapt themselves to the light of the central portion. As shown in FIG. 4C, the irradiation pattern on the screen 20 is in a form of a semicircular irradiation pattern shaded by the shading plate 17. The hue evaluation is conducted primarily in the color heterogeneity generation region around the semicircular irradiation pattern.

Figure 5:
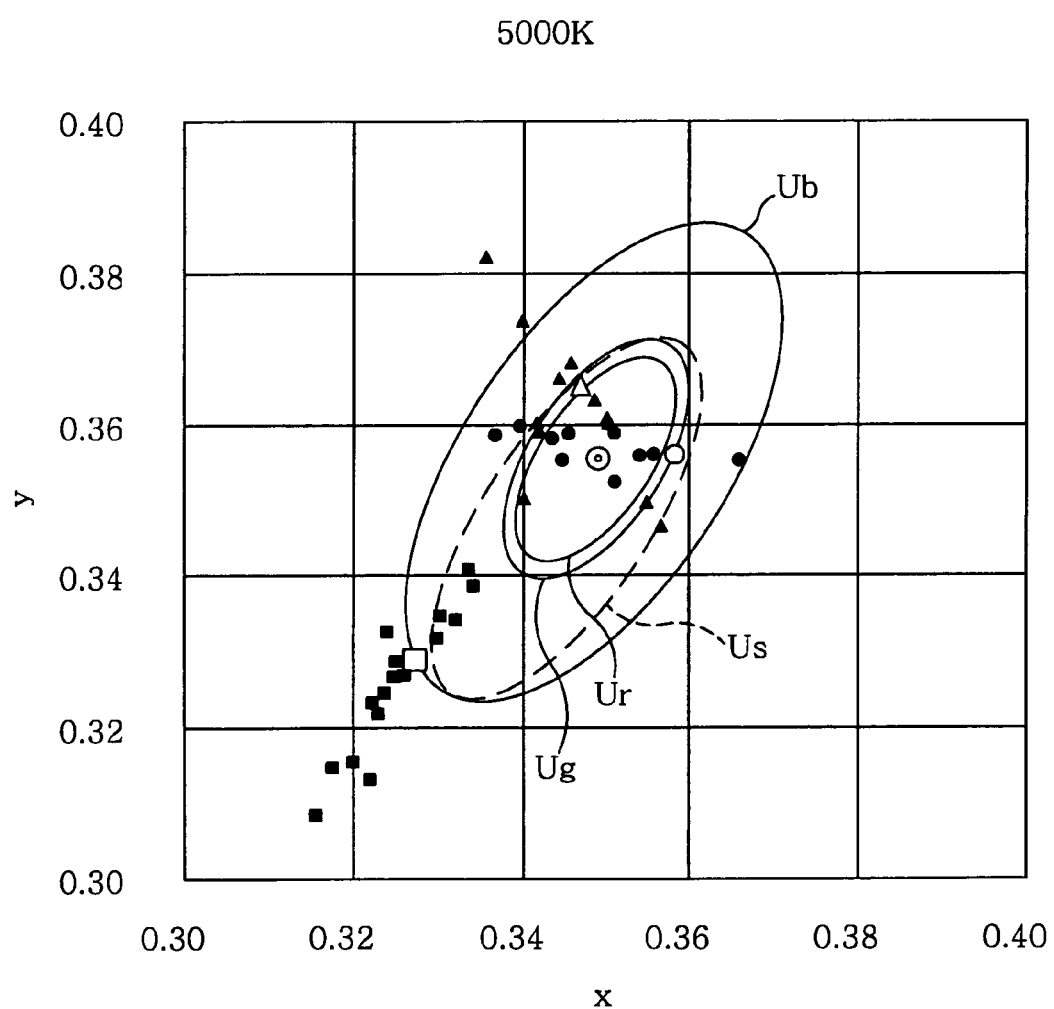
FIG. 5 is an x-y chromaticity diagram showing results of the color heterogeneity evaluation test.

The tests are performed in the following method. After adapting himself or herself to the irradiation pattern for about 5 minutes, a tester adjusts, with an adjacent controller (not shown), the rotation angle of the LED package 14 attached to the rotary disc 16 from the state in which the chromaticity difference between the central portion and the peripheral portion of the irradiation pattern is great. The intensity of monochromic light in the peripheral portion of the irradiation pattern is adjusted to obtain a permissible irradiation pattern that can be accepted by the test subjects M. Thereafter, the permissible irradiation pattern is measured by a measuring instrument positioned at the rear side. After a second adaptation period for about one minute has lapsed, the same adjustment task as mentioned just above is carried out four times. The measuring instrument used herein includes a two-dimensional luminance colorimeter, an XYZ filter, a high-resolution CCD camera and the like FIG. 5 is an x-y chromaticity diagram showing the test results when the color temperature of the central portion is 5000K. In FIG. 5, the average center chromaticity of the permissible irradiation pattern is indicated as mark ◉. The chromaticities having the greatest difference from the center chromaticity within a 1/10 luminance level of the permissible irradiation pattern are indicated by mark ■ in case 1, mark ▲ in case 2 and mark ● in case 3 for each of the test subjects.

White marks □, △ and ○ indicate the average values of the chromaticities having the greatest difference from the center chromaticity in the respective hues. As can be seen in this x-y chromaticity diagram, the permissible chromaticity difference varies greatly depending on the hue. The blue color has the greatest permissible chromaticity difference. With respect to the red color, the hue having the greatest chromaticity difference is adjusted to be the complementary color. Thus, the evaluation has been conducted in a strict manner.

The x-y chromaticity diagram is not a uniform color coordinate system, which means that the difference of colors is not so great even if the x-y chromaticities have a great difference. In view of this, the chromaticities are converted to the Macadam's standard deviation ellipses that serve as basic data in the uniform color coordinate system. In FIG. 5, there are illustrated ellipses Ub, Ug and Ur corresponding to the cases 1 through 3. In case where the permissible chromaticity differences of the colors are compared using the Macadam's standard deviation ellipses thus converted, the blue color has the greatest multiple while the red color has the smallest multiple. The tests conducted as above reveal that the tolerance in the red hue direction is most strict and needs to be five or less in terms of the Macadam's ellipse multiple. It can also be noted in the above tests that the tolerance in the blue hue direction is least strict and may be ten or less in terms of the Macadam's ellipse multiple.

It can be seen in the above tests that, if the blue color is allowed to appear in the periphery of the irradiation light, a good irradiation pattern can be realized with no perception of color heterogeneity even when a certain level of color deviation occurs. In FIG. 5, the permissible chromaticity curve Us resulting from the test results is indicated by a dot-line ellipse. This permissible chromaticity curve Us shows that, if the chromaticity difference from the center falls within the permissible chromaticity curve Us, an irradiation pattern having reduced likelihood of perception of color heterogeneity can be realized in the region whose luminance level is within 1/10 of the luminance of the central region.

Figure 6A:
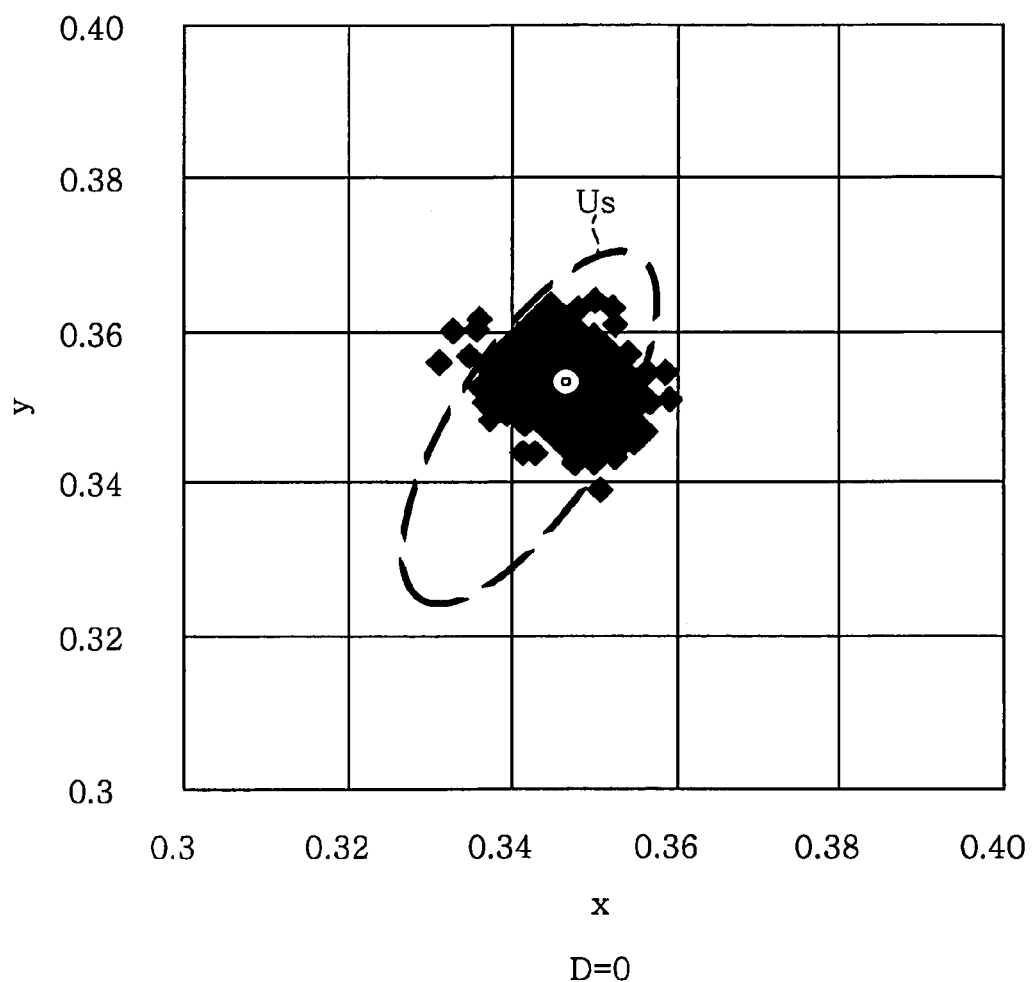
FIG. 6A is a chromaticity distribution diagram available when the shift distance D of a blue LED chip of the LED illumination device is equal to zero.
Figure 6B:
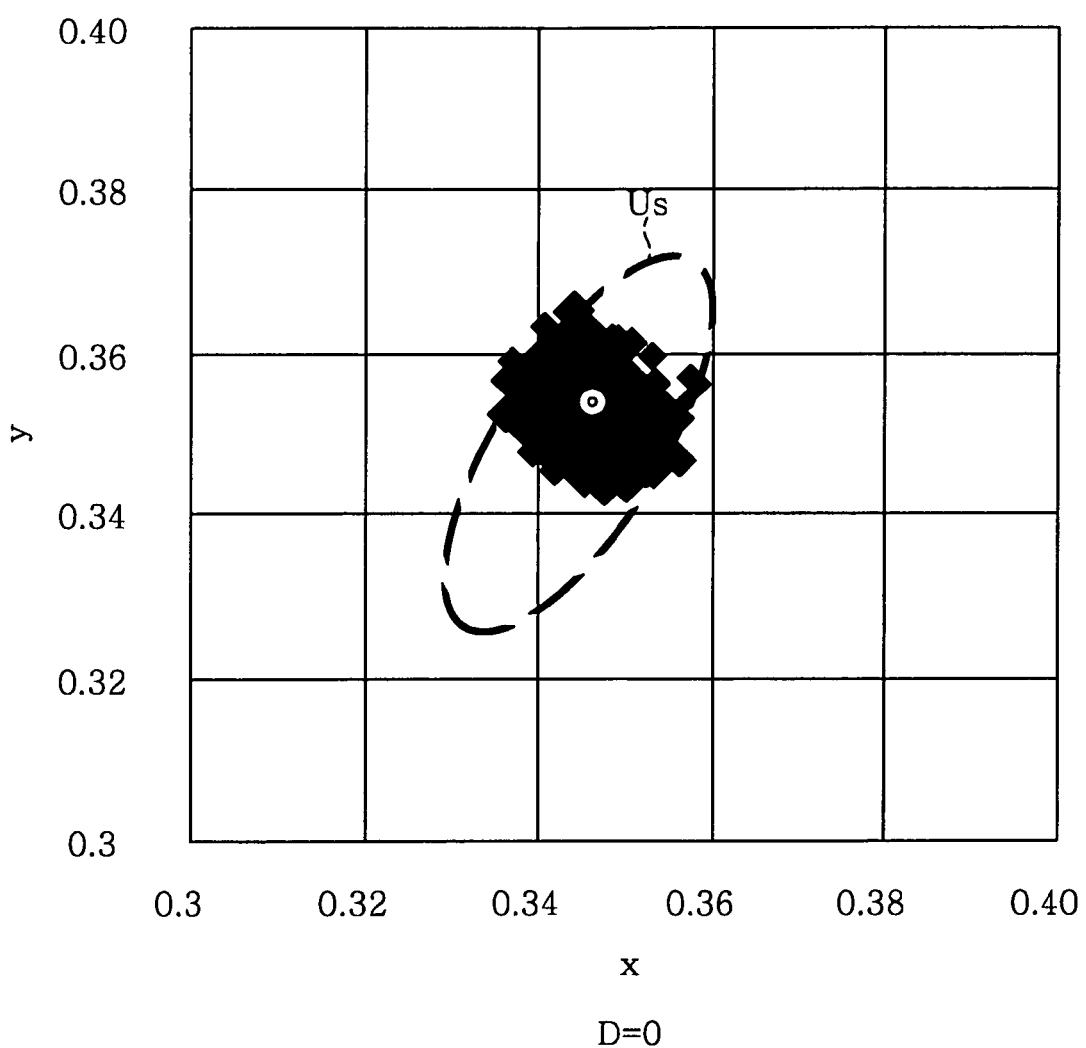
FIG. 6B is a chromaticity distribution diagram available when the shift distance D is equal to 2 mm.
Figure 6C:
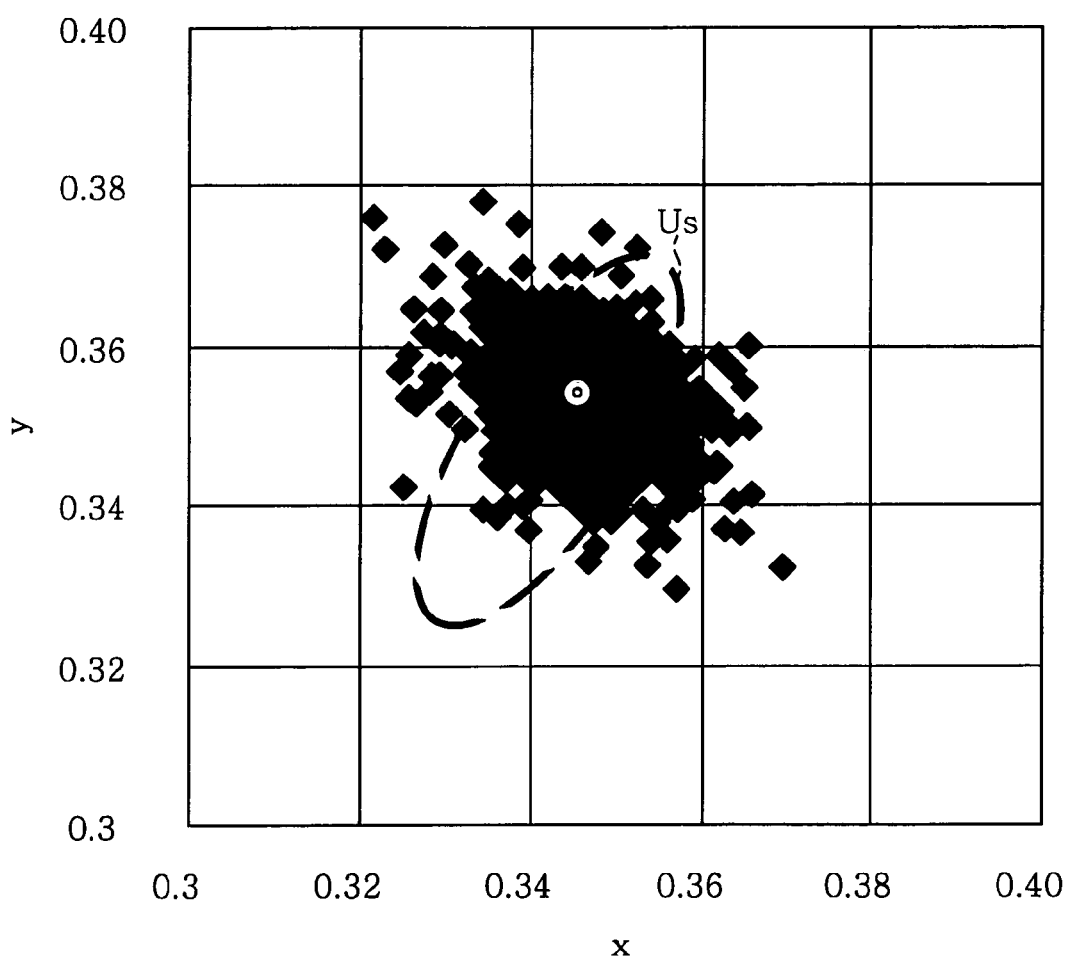
FIG. 6C is a chromaticity distribution diagram available in a comparative conventional LED illumination device.

The chromaticity distributions on the irradiation surface formed by the LED illumination device 1 in accordance with the present embodiment are illustrated in FIGS. 6A, 6B and 6C. FIG. 6A illustrates the calculation results of chromaticity distribution in the region whose luminance level is within 1/10 of the luminance of the central region of the irradiation pattern. In this regard, the blue LED chip 43 is assumed to be in an initial position, meaning that the shift distance D is equal to zero. The respective LED chips 41, 42 and 43 are assumed to have a Lambertian light distribution (i.e., a perfectly dispersed light distribution having a constant luminance regardless of the observation direction). The wavelengths of the red, green and blue LED chips 41, 42 and 43 calculated on this assumption are 630 nm, 515 nm and 450 nm, respectively. FIG. 6B illustrates the calculation results of chromaticity distribution in case where the blue LED chip 43 is shifted with a shift distance D of 2 mm.

FIG. 6C illustrates the calculation results of chromaticity distribution in the comparative LED illumination device 1A shown in FIG. 3A, in which the green LED chips and the blue LED chips are arranged on a circle concentric with the center of the red LED chip. In this LED arrangement, as is apparent in FIG. 6C, the chromaticity distributions in the red and green hue directions from the permissible chromaticity curve Us are conspicuous. Thus, the color heterogeneity is likely to occur in the irradiation pattern.

In contrast, the chromaticity distribution in the LED illumination device 1 in accordance with the present embodiment available when the shift distance is equal to zero as in FIG. 6A is concentrated within the permissible chromaticity curve Us unlike the LED illumination device 1A. The chromaticity distributions in the red and green hue directions grow smaller. This provides a good chromaticity distribution characteristics with which the color heterogeneity is hard to occur in the irradiation pattern.

In case where the shift distance of the blue LED chip is set equal to 2 mm as illustrated in FIG. 6B, the chromaticity distribution is concentrated within the permissible chromaticity curve Us. This makes it possible to obtain a better chromaticity distribution characteristics. It can be seen that the color heterogeneity is reduced if the blue LED chip is arranged farthest from the center point P1 of the substrate 3. This effect is sufficiently provided if the shift distance D of the blue LED chip 43 is twice as great as the length of one side of the square LED chip.

With the LED illumination device 1 in accordance with the present embodiment, it is possible to distribute the light so that only the blue hue having an increased permissible chromaticity difference is distributed near the periphery of the irradiation light. Therefore, the color heterogeneity is hard to occur in the peripheral portion of the irradiation pattern when the LED illumination device 1 is used as a spotlight. In other words, the colors are arranged in consideration of the color in the peripheral portion of the irradiation pattern as well as the color in the central portion so that only the hue generating no color contrast effect in the peripheral portion appears in the peripheral portion of the irradiation pattern.

The blue hue that, as confirmed by the subjective evaluation testes, makes it most difficult to perceive the luminance difference and the chromaticity difference is used as the hue generating no color contrast effect. This makes it possible to reduce the color heterogeneity of the irradiation pattern. Although the green LED chips 42 are arranged on the third circle 46 concentric with the first circle 44 in the present embodiment, they may be non-concentrically arranged as long as the centers thereof lie in the region between the first circle 44 and the second circle 45.

Figure 7A:
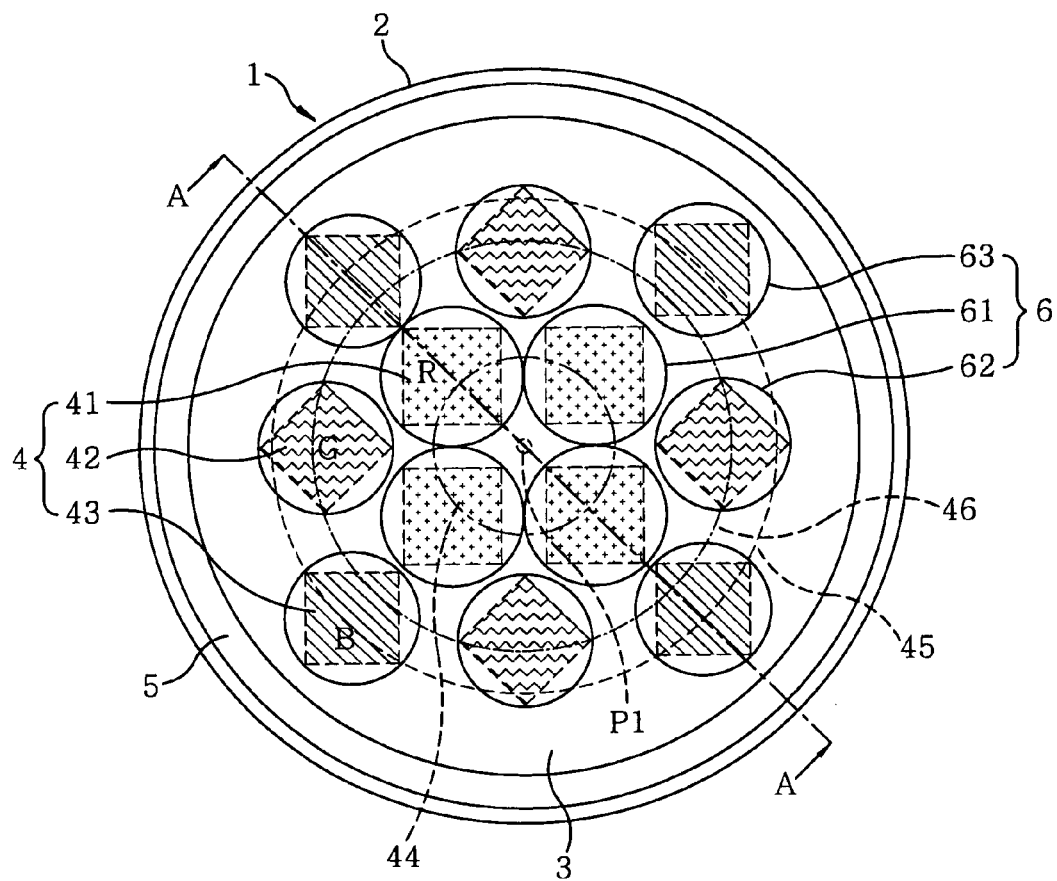
FIG. 7A is a plane view showing an LED illumination device in accordance with a second embodiment of the present invention.

Next, an LED illumination device in accordance with a second embodiment of the present invention will be described with reference to FIGS. 7A, 7B and 7C. The LED illumination device in accordance with the present embodiment includes a bell-shaped sealing portion 6 for covering the respective LED chips. Other configurations of the present embodiment remain the same as those of the preceding embodiment. The sealing portion 6 is formed so that the curvature in the position where the surface thereof intersects the optical axes P2 of the LED chips 4 becomes greatest above the red LED chips and smallest above the blue LED chips. Thus, the light distribution shapes of the LED chips are changed so that the blue hue can easily appear in the periphery of the irradiation pattern.

The sealing portion 6 is made of a sealing material, e.g., a resin, which has a refractive index greater than an air. The refractive index of the sealing material is set substantially equal to the refractive index (about 2.5) of the semiconductors forming the LED chips, thereby increasing the light ejection efficiency with which the light is ejected from the LED chips 4 to the outside. As shown in FIG. 7A, the sealing portion 6 includes individual sealing members 61, 62 and 63 for sealing the red, green and blue LED chips 41, 42 and 43.

Figure 7B:
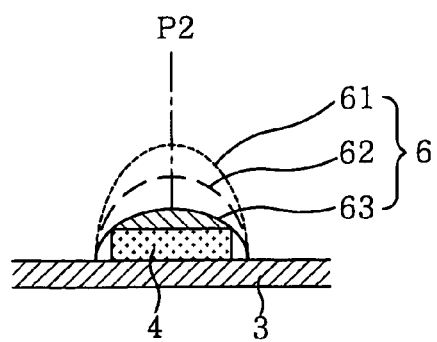
FIG. 7B is a side view illustrating the sealing portion employed in the LED illumination device of the second embodiment.

As can be seen in FIG. 7B, the sealing members 61, 62 and 63 are arranged so that the central axes thereof about which the bell shapes make a rotational symmetry substantially coincide with the optical axes P2 of the LED chips 4. In addition, the sealing members 61, 62 and 63 are formed so that the curvatures at the points where the bell-shaped surfaces thereof intersect the optical axes P2 of the LED chips 4 become greatest in the sealing member 61 and smallest in the sealing member 63.

Figure 7C:
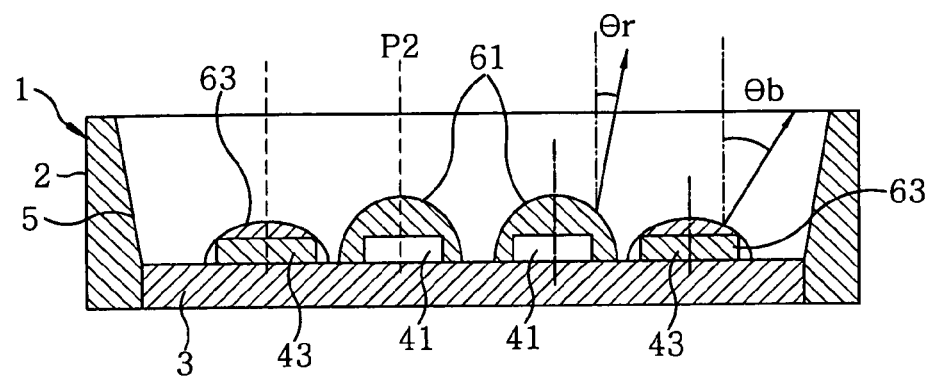
FIG. 7C is a cross sectional view taken along line A-A in FIG. 7A.

Referring to FIG. 7C, θb is greater than θr, wherein θr and θb denote the angles between the optical axes P2 of the LED chips 4 and the light beams emitted from the centers of the red LED chips 41 and the blue LED chips 43 at the same angle and then refracted in the surfaces of the sealing members 61 and 63. This means that the light beams of the blue LED chips 43 are projected at a wider angle.

Figure 8:
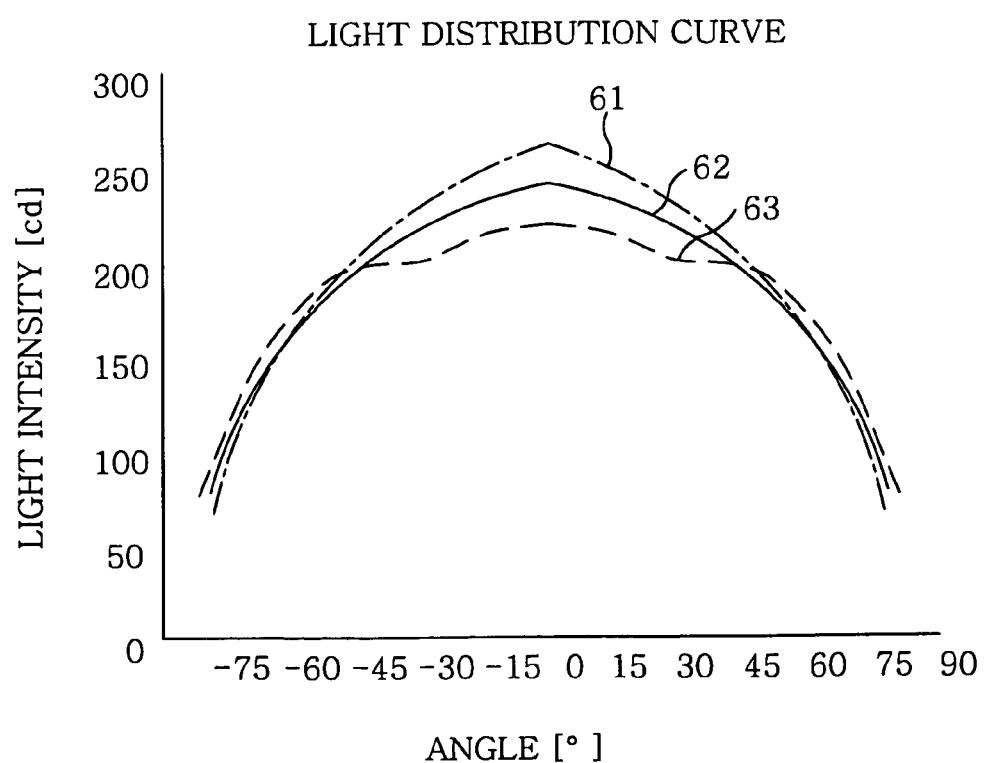
FIG. 8 is a graph representing light distribution curves for the respective sealing members of the LED illumination device of the second embodiment.

FIG. 8 shows the calculation results of light distribution curves based on the shapes of the sealing members 61, 62 and 63, wherein the LED chips 4 are used as the light sources of Lambertian light distribution and the refractive index of the sealing members 61, 62 and 63 is assumed to be 1.425. In this figure, the vertical axis indicates the light intensity cd and the horizontal axis signifies the angle measured from the optical axes P2 of the LED chips 4. As is apparent from these light distribution curves, the central light intensity is increased as the curvature of the sealing portion 6 becomes greater, while the peripheral light intensity is increased as the curvature of the sealing portion 6 gets smaller.

Therefore, the blue hue appears in the periphery of the irradiation pattern when the curvature of the sealing member 61 of the red LED chip 41 is set greatest and the curvature of the sealing member 63 of the blue LED chip 43 is set smallest. This can prevent the color heterogeneity. By applying the sealing members 61, 62 and 63, it is unnecessary to increase the distance between the blue LED chip 43 and the center point P1 of the substrate 3.

Figure 9A:
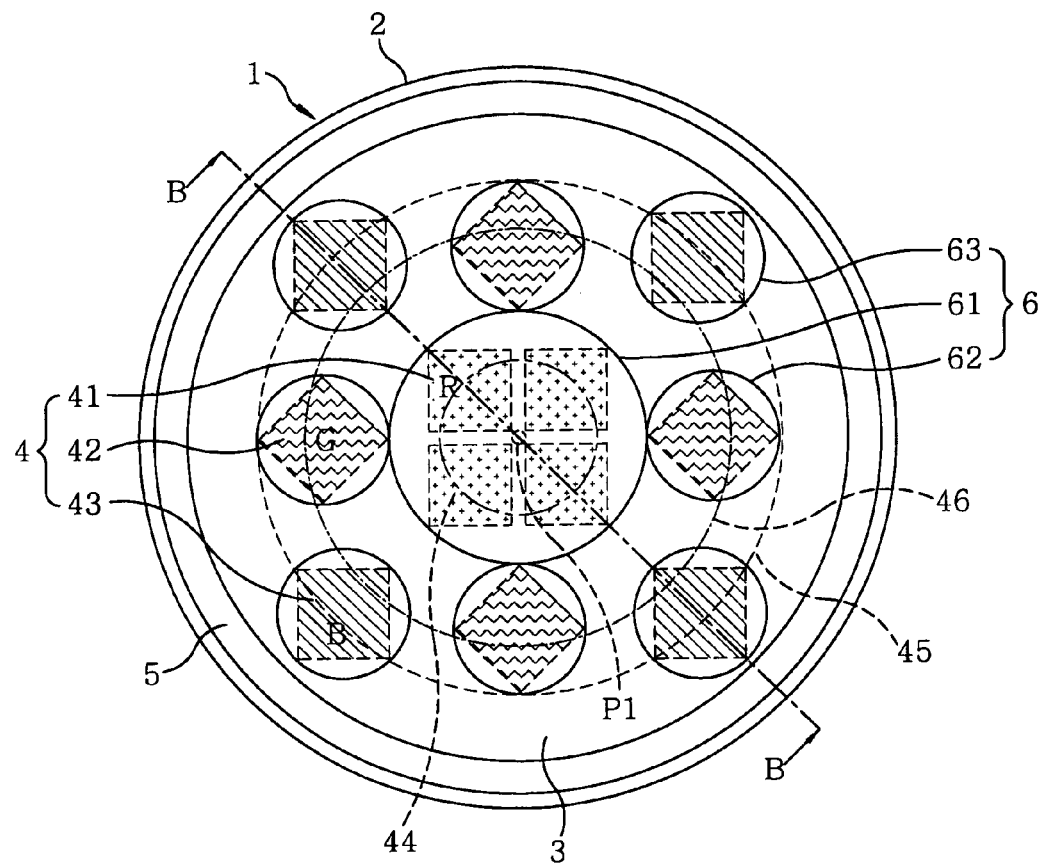
FIG. 9A is a plan view showing an LED illumination device in accordance with a modified example of the second embodiment.
Figure 9B:
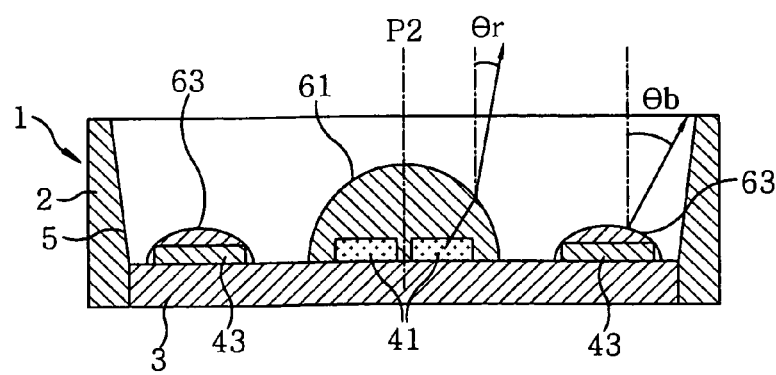
FIG. 9B is a cross sectional view taken along line B-B in FIG. 9A.

Next, an LED illumination device in accordance with a modified example of the second embodiment will be described with reference to FIG. 9. In this modified example, the sealing member 61 of the sealing portion 6 covers the four red LED chips 41 arranged in the central portion of the substrate 3.

The sealing member 61 has a bell shape and is formed to cover all the four red LED chips 41 positioned around the center point P1 of the substrate 3. If the four red LED chips 41 are regarded as a single LED chip, the optical axis P2 thereof coincides with the normal line extending from the center point P1 of the substrate 3. The curvature at the intersecting point between the optical axis P2 of the red LED chips 41 and the sealing member 61 is set greater than the curvature near the intersecting point between the optical axis of each blue LED chip 43 and the sealing member 63.

With this modified example, θb is greater than θr, wherein θr and θb respectively denote the angles between the optical axes P2 of the LED chips 4 and the light beams emitted from the centers of the red LED chips 41 and the blue LED chips 43 at the same angle and then refracted in the surfaces of the sealing members 61 and 63. This can prevent the color heterogeneity in the periphery of the irradiated light. In addition, this makes it possible to reduce the number of parts of the sealing portion, which leads to reduced production steps and increased workability.

Figure 10A:
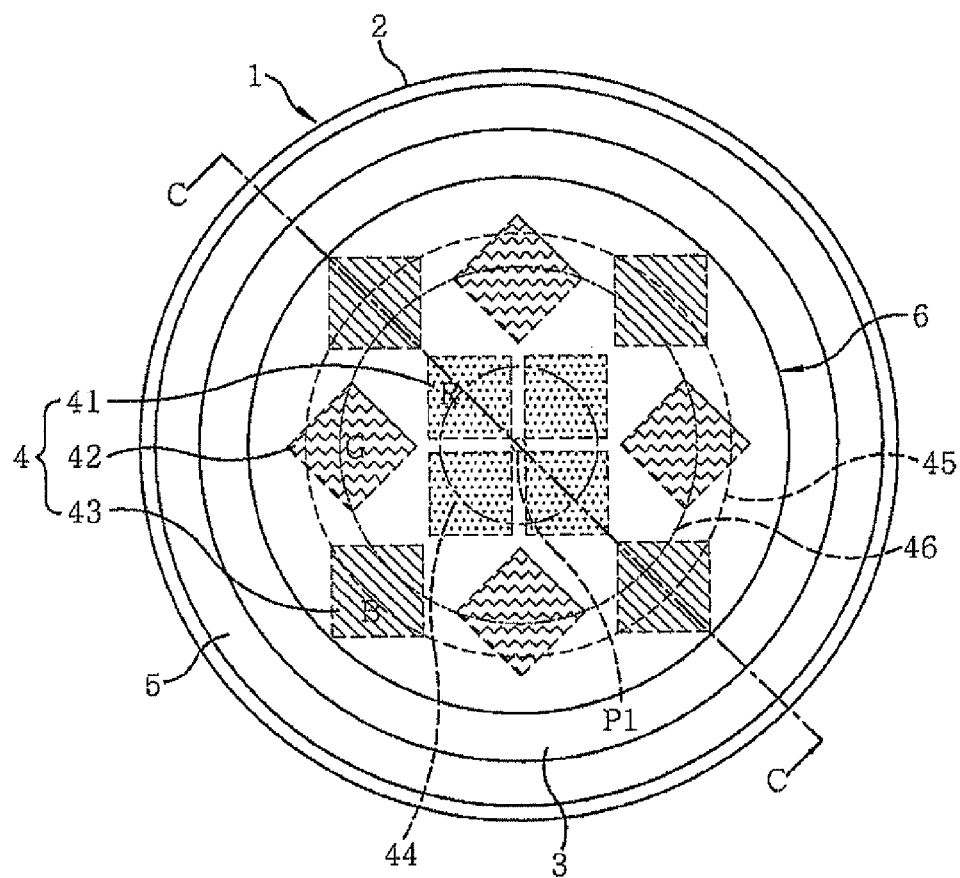
FIG. 10A is a plane view showing an LED illumination device in accordance with a third embodiment of the present invention.
Figure 10B:
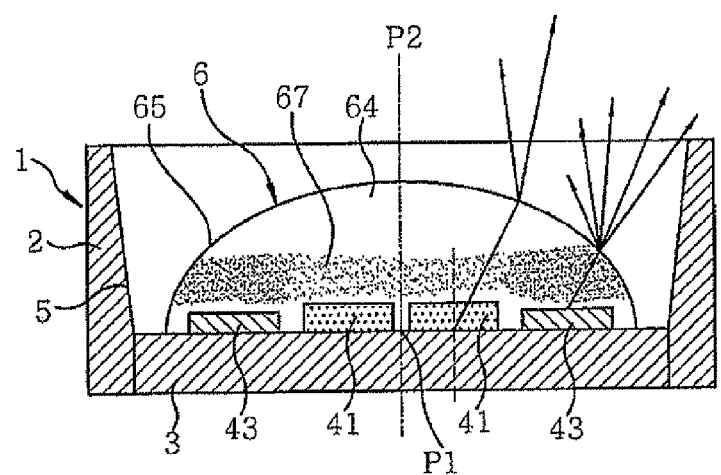
FIG. 10B is a cross sectional view taken along line C-C in FIG. 10A.

Next, an LED illumination device in accordance with a third embodiment of the present invention will be described with reference to FIGS. 10A and 10B. In the present embodiment, the sealing portion 6 covers all the LED chips and contains a light diffusion agent 67. The concentration of the light diffusion agent 67 is greater in the peripheral region of the first circle 44 than in the central region thereof.

The sealing portion 6 is formed of a single bell-shaped sealing member. The central axis of the sealing portion 6 is arranged to pass through the center point P1 of the substrate 3. In case where, e.g., silicon is used as the sealing material of the sealing portion 6, titanium oxide or the like may be used as the light diffusion agent 67, thereby adjusting the concentration of the light diffusion agent 67 and hence the diffusion performance of diffusing the light emitted from the LED chips 4. Since the light is diffused well at the higher concentration of the light diffusion agent 67, the concentration of light diffusion agent 67 in the sealing portion 6 is adjusted so that it becomes higher near the periphery of the sealing portion 6 than near the center point P1 of the first circle 44.

In accordance with the present embodiment, the sealing portion 6 is configured to contain the light diffusion agent 67 and to cover all the LED chips. The concentration of the light diffusion agent 67 is made lower in a central region 64 of the substrate 3 closer to the red LED chips 41 and higher in a peripheral region 65 of the sealing portion 6 closer to the blue LED chips 43. Thanks to this feature, it is possible to make the light distribution of the blue LED chips broader than that of the red LED chips. Therefore, it is possible to reduce the likelihood of occurrence of color heterogeneity without providing individual sealing members in the respective LED chips 4. This results in a reduction in the number of production steps and in the production cost.

Figure 11A:
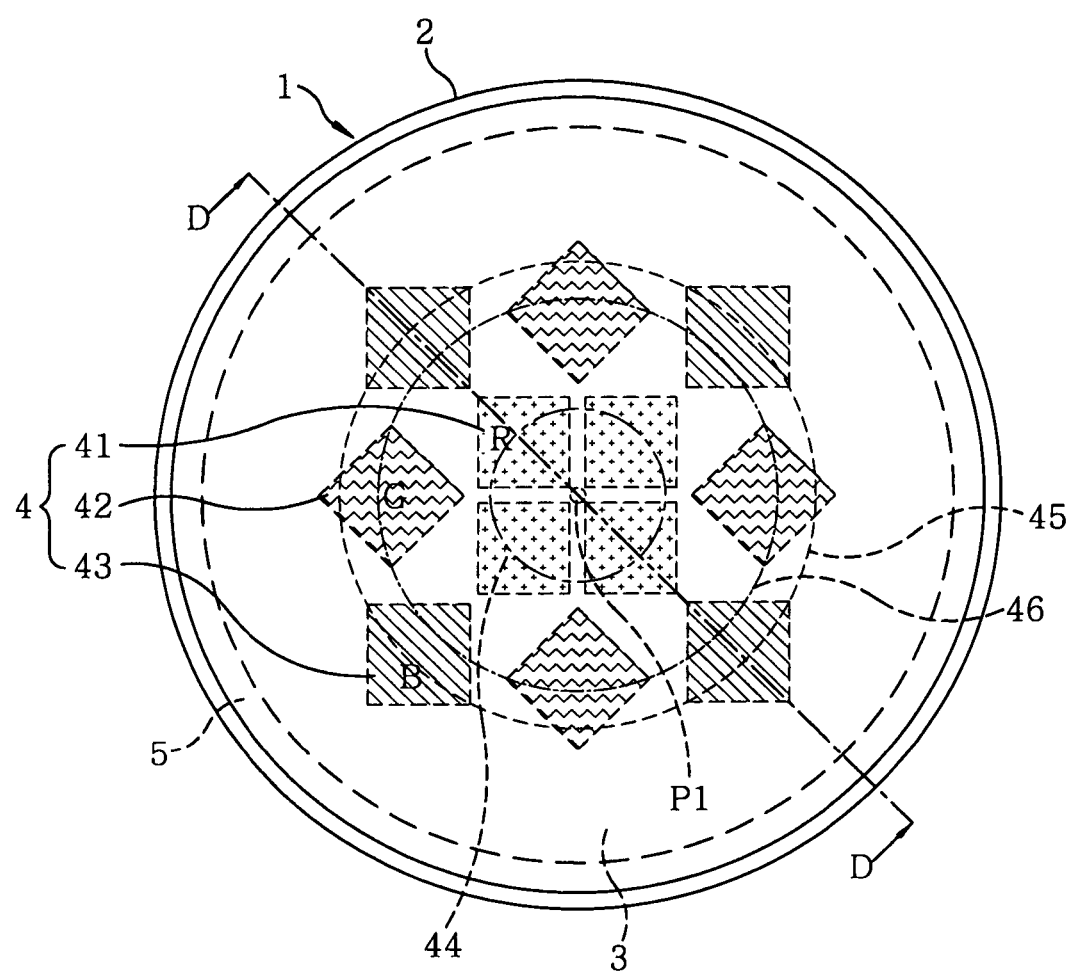
FIG. 11A is a plane view showing an LED illumination device in accordance with a fourth embodiment of the present invention.
Figure 11B:
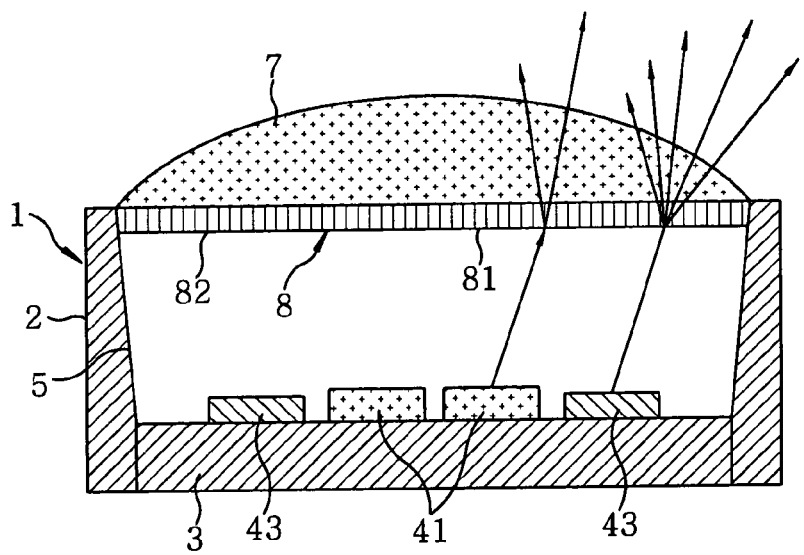
FIG. 11B is a cross sectional view taken along line D-D in FIG. 11A.
Figure 11C:
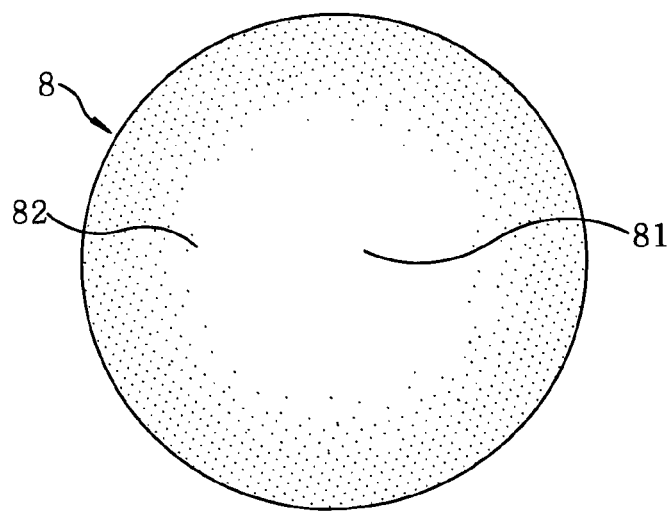
FIG. 11C illustrates the distribution of diffusion concentration in a diffusion member of the LED illumination device of the fourth embodiment.

Next, an LED illumination device in accordance with a fourth embodiment of the present invention will be described with reference to FIGS. 11A to 11C. The LED illumination device in accordance with the present embodiment is similar in configuration to the LED illumination device in the third embodiment and includes a light diffusion member 8 arranged at the light irradiation side of the LED chips. The diffusion member 8 has greater diffuseness in the peripheral region of the first circle 44 than in the central region thereof.

More specifically, the LED illumination device 1 in accordance with the present embodiment includes a collector lens 7 provided at the light projection side of the body 2 for collecting the light emitted from the LED chips 4 and a diffusion member 8 arranged between the collector lens 7 and the LED chips 4. The collector lens 7 is employed when the LED illumination device 1 is used as a spotlight, particularly when there is a need to realize light distributions of middle and narrow angle.

The diffusion member 8 is formed of a substantially-transparent circular flat resin member. The diffuseness of the diffusion member 8 is greater in the peripheral region 82 thereof than in the central portion 81 facing the center point P1 of the first circle 44 in the substrate 3.

The diffuseness can be increased by, e.g., adding an increased amount of light diffusion agent to the resin member, forming deep irregularities on the surface of the resin member through a micro-machining process, or increasing surface roughness.

In accordance with the present embodiment, the light distribution of the blue LED chips 43 can be easily made broader than that of the red LED chips 41 by using the diffusion member 8 without performing the complicated process of adding the light diffusion agent to the bell-shaped sealing portion as mentioned above.

Therefore, the light emitted from the blue LED chips can be distributed to the peripheral region by merely providing the diffusion member 8. This makes it easy to reduce the likelihood of occurrence of color heterogeneity. Alternatively, the diffusion member 8 may be omitted when the diffuseness of the collector lens 7 is changed by forming minute irregularities on the rear surface of the collector lens 7, increasing the surface roughness thereof through a sandblasting method or the like.

Figure 12A:
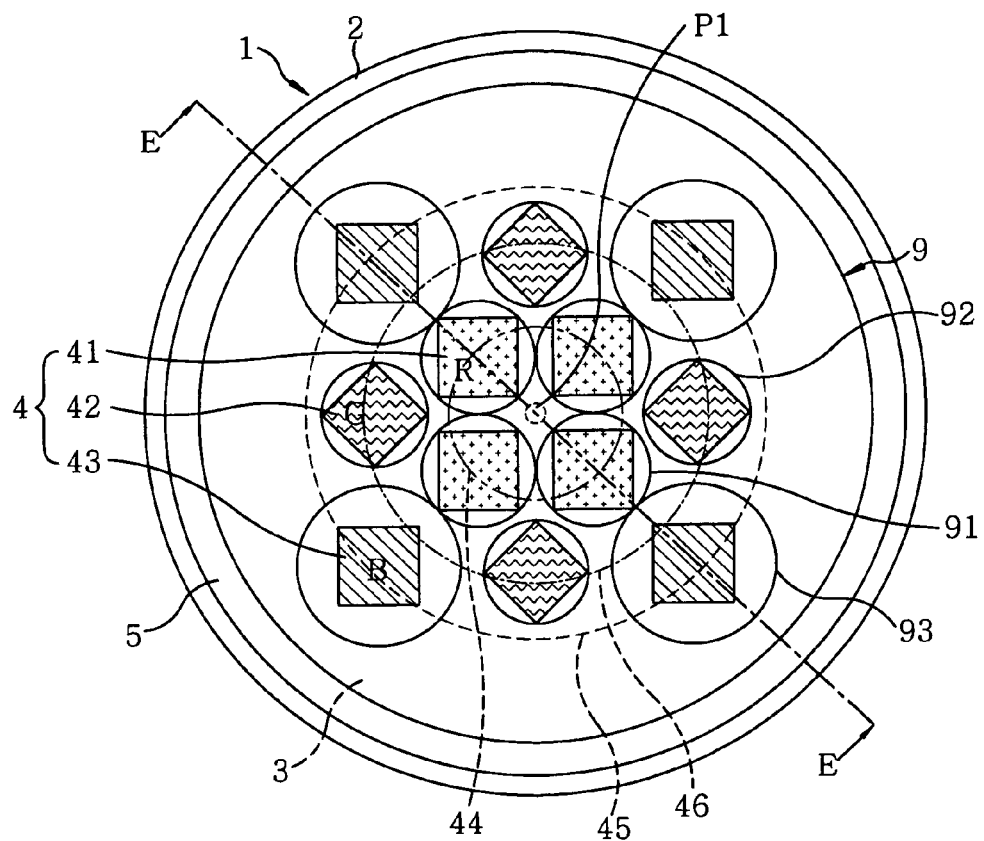
FIG. 12A is a plane view showing an LED illumination device in accordance with a fifth embodiment of the present invention.
Figure 12B:
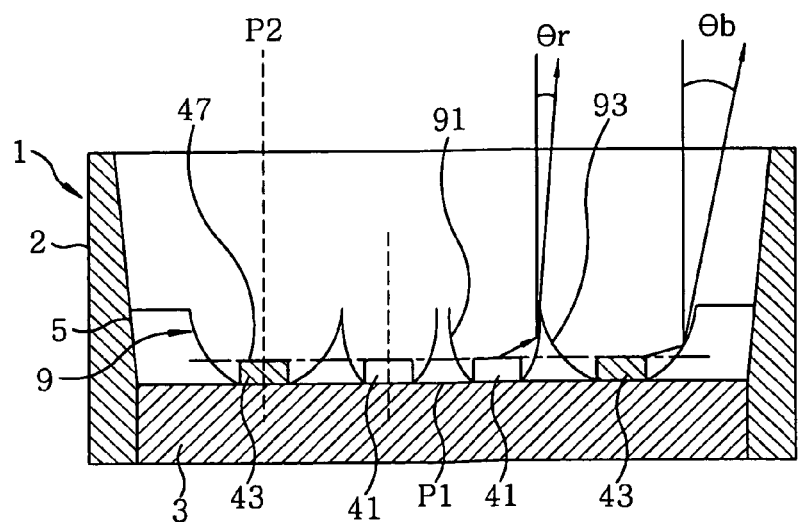
FIG. 12B is a cross sectional view taken along line E-E in FIG. 12A.

Next, an LED illumination device in accordance with a fifth embodiment of the present invention will be described with reference to FIGS. 12A and 12B. The LED illumination device in accordance with the present embodiment includes reflection plate 9 arranged at the light irradiation side of the LED chips 4. The reflection plate 9 has a bell-shaped inner wall. The curvatures of the surfaces of the reflection plate 9 near the intersecting points between the reflection plate 9 and the light emission surfaces 47 of the LED chips 4, the reflection plate 9 has a smaller curvature portions around the blue LED chips 43 and greater curvature portion around the red LED chips 41. The reflection plate 9 is employed when the LED illumination device 1 is used as a spotlight, particularly when there is a need to realize light distributions of middle and narrow angle.

The reflection plate 9 includes bell-shaped concave reflection portions 91, 92 and 93 for reflecting the light emitted from the red, green and blue LED chips 41, 42 and 43. The reflection portions 91, 92 and 93 are arranged so that the central axes thereof coincide with the optical axes P2 of the respective LED chips. The light emission surfaces 47 of the red, green and blue LED chips 41, 42 and 43 are positioned substantially at the same height from the substrate 3. The curvatures of the reflection portions 91, 92 and 93 near the intersecting points between the extension surfaces of the light emission surfaces 47 and the reflection portions 91, 92 and 93 are set so that the reflection portion 93 has a smaller curvature than that of the reflection portion 91.

In accordance with the present embodiment, θb is greater than θr, wherein θr and θb denote the angles between the normal lines of the LED chips 4 and the light beams emitted from the centers of the red LED chips 41 and the blue LED chips 43 at the same angle and then reflected from the surfaces of the reflection portions 91 and 93. This means that the light beams of the blue LED chips 43 are diffused at a wider angle. Therefore, the light distributions of the blue LED chips 43 can be made wider than that of the red LED chips 41, while protecting the occurrence of color heterogeneity. Since the light emitted from the LED chips 4 are diffused by the reflection plate 9, the light transmission loss is reduced and the light amount is increased as compared with the case where the sealing members are used.

The present invention is not limited to the configurations of the foregoing embodiments but may be modified in many different forms without departing from the scope of the invention. For example, the red, green and blue LED chips may be two, three or more than four, respectively, although the number of the red, green and blue LED chips is four in the respective embodiments described above. As a further alternative example, one red LED chip may be arranged at the center and two, three or more than four green and blue LED chips may be arranged around the red LED chip.

What is claimed is:

1. A light emitting diode (LED) illumination device comprising:
    a substrate;
    a plurality of red LED chips arranged on the substrate;
    a plurality of blue LED chips arranged on the substrate; and
    a plurality of third-color LED chips arranged on the substrate,
    wherein respective centers of the plurality of red LED chips are arranged on a circumference of a first circle having as its center a point on the substrate, respective centers of the plurality of blue LED chips are arranged on a circumference of a second circle concentric with and greater than the first circle, and respective centers of the plurality of third-color LED chips are arranged in a region between the first circle and the second circle,
    wherein the LED illumination device further comprises a bell-shaped sealing portion covering all of the plurality of red, the plurality of blue and the plurality of third-color LED chips, the bell-shaped sealing portion containing a light diffusion agent, and
    wherein the total concentration of the light diffusion agent contained within the bell-shaped sealing portion is greater in the entire region directly above the plurality of blue LED chips than in the entire region directly above the plurality of red LED chips so that the light distribution of the plurality of blue LED chips is broader than that of the plurality of red LED chips.

2. The LED illumination device of claim 1, wherein each of the plurality of blue LED chips has a square shape and a distance between the center of each of the plurality of red LED chips and that of a blue LED chip closest thereto is not less than twice a length of one side of the blue LED chip.

* * * * *